(12) United States Patent
Kramer et al.

(10) Patent No.: US 10,775,833 B2
(45) Date of Patent: Sep. 15, 2020

(54) MEETING SETUP/HOLD TIMES FOR A REPETITIVE SIGNAL RELATIVE TO A CLOCK

(71) Applicant: TEXAS INSTRUMENTS INCORPORATED, Dallas, TX (US)

(72) Inventors: Paul Joseph Kramer, Fort Collins, CO (US); Matthew Hansen Childs, Fort Collins, CO (US); Robert Callaghan Taft, Munich (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 179 days.

(21) Appl. No.: 15/911,138

(22) Filed: Mar. 4, 2018

(65) Prior Publication Data

US 2018/0253122 A1    Sep. 6, 2018

Related U.S. Application Data

(60) Provisional application No. 62/466,965, filed on Mar. 3, 2017.

(51) Int. Cl.
   *G06F 1/10*     (2006.01)
   *H03K 5/01*    (2006.01)
   (Continued)

(52) U.S. Cl.
   CPC ............ *G06F 1/08* (2013.01); *G06F 1/10* (2013.01); *H03K 5/01* (2013.01); *H03K 2005/00286* (2013.01)

(58) Field of Classification Search
   CPC .............. G06F 1/08; G06F 1/10; H03K 5/01
   See application file for complete search history.

(56) References Cited

U.S. PATENT DOCUMENTS

| 6,232,811 B1 | 5/2001 | Ihm |
| 6,453,373 B1 * | 9/2002 | Rodriguez .......... G06F 13/4213 710/107 |

(Continued)

FOREIGN PATENT DOCUMENTS

| RU | 2105415 C1 | 2/1998 |
| WO | 2001050286 A1 | 7/2001 |

OTHER PUBLICATIONS

Michael et al. capturing and evaluating high-frequency signals, Jan 1, 2006, (https://www.evaluationengineering.com/capturing-and-evaluating-high-frequency-signals.php).

(Continued)

*Primary Examiner* — Patrick O Neill
(74) *Attorney, Agent, or Firm* — John R. Pessetto; Charles A. Brill; Frank D. Cimino

(57) ABSTRACT

Clock generation for capturing a repetitive signal relative to a clock includes clock circuitry to provide a clock with active and inactive clock edges within a clock period, and signal capture circuitry to capture repetitive signal transitions at an active clock edge, based on pre-defined setup and hold times which determine a setup/hold window. Clock phase adjustment circuitry is configured to adjust clock phase so that the repetitive signal transitions occur within a signal capture window between setup/hold windows. Clock phase adjustment can be based on: aligning the clock inactive edges to the repetitive signal transitions; and/or averaging successive phase comparisons of the clock and the repetitive signal transitions; and/or selectively performing an initial polarity inversion to generate a polarity inverted clock, and then adjusting clock phase of the polarity inverted clock. An example implementation is JESD204B (subclass1) to adjust DEVCLK phase relative to a SYSREF timing reference control signal.

24 Claims, 5 Drawing Sheets

(51) Int. Cl.
*G06F 1/08* (2006.01)
*H03K 5/00* (2006.01)

(56) References Cited

U.S. PATENT DOCUMENTS

| | | | |
|---|---|---|---|
| 7,049,869 B2 | 5/2006 | d'Haene et al. | |
| 8,970,276 B1 | 3/2015 | McShea et al. | |
| 9,083,353 B2* | 7/2015 | Sasaki | H03L 7/08 |
| 9,524,759 B2* | 12/2016 | Nam | H03K 5/1502 |
| 9,923,711 B2* | 3/2018 | Zerbe | H04L 7/0332 |
| 2014/0023048 A1 | 1/2014 | Vu et al. | |

OTHER PUBLICATIONS

PCT Search Report for Application No. PCT/US 2018/020940, dated Jun. 21, 2018.
Supplementary European Search Report in corresponding EP Patent Application No. EP18761737, dated Feb. 12, 2020 (3 pages).

* cited by examiner

MEETING SETUP/HOLD TIMES FOR A REPETITIVE SIGNAL RELATIVE TO A CLOCK

CROSS-REFERENCE TO RELATED APPLICATIONS

Priority is claimed under 37 CFR 1.78 and 35 USC 119(e) to US Provisional Application 62/466,965, filed 2017 Mar. 3, which is incorporated by reference in its entirety.

BACKGROUND

Integrated circuits including clocked digital logic operate with data and control signals. Data signals (or just "data") are signals that are evaluated by a circuit. Control signals can be used to assert, reset or synchronize functions within an integrated circuit, and can treated as data.

For clocked digital designs, evaluation of control/data signal transitions (from de-asserted to asserted at a rising or falling edge) is done at a clock's active edge (rising or falling). This signal evaluation is referred to as signal capture or latching.

Control/data signals are latched based on setup and hold times in relation to the clock active edge. Setup is the minimum time before a clock active edge that the control/data signal must be stable (unchanging) for it to be predictably latched. Hold is the minimum time after the clock active edge during which data must be stable (unchanging) for it to be predictably latched. Clock setup/hold times depend on circuit design, including operational parameters, such as settling times and signal path timing requirements, and clock/signal frequencies.

With predictable latching based on meeting setup/hold requirements, signal capture can be deterministic. That is, control/data signals can be captured deterministically only if the control/data signal transitions meet the clock setup/hold times. For example, control/data signal transitions that occur within a setup/hold window at an active clock edge cannot be captured deterministically relative to that clock active edge.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for clock generation with clock phase adjustment to align a clock-active-edge setup/hold window relative to a repetitive signal, positioning the repetitive signal (transition/assertion) within a signal capture window to meet setup/hold requirements.

According to aspects of the Disclosure, a circuit includes a clock module for capturing a repetitive signal relative to a clock. The clock module includes, a signal input to receive a repetitive signal with repetitive signal transitions, clock circuitry to provide a clock with active and inactive clock edges within a clock period, and signal capture circuitry to capture the repetitive signal transitions at an active clock edge based on pre-defined setup and hold times which determine a setup/hold window. The clock module includes clock phase adjustment circuitry to adjust clock phase so that the repetitive signal transitions occur within a signal capture window between setup/hold windows.

In other aspects of the Disclosure, a device for use in a system with multiple devices and a system clock generator that provides a system device clock and a repetitive control signal is disclosed, the device including a clock interface to receive the system device clock, and the repetitive control signal with repetitive control signal transitions. The device includes a clock module to generate an internal device clock based on the system device clock and the repetitive control signal, the clock module including clock circuitry to provide the internal device clock with active and inactive clock edges within a clock period, and signal capture circuitry to capture the repetitive control signal transitions at an active clock edge based on pre-defined setup and hold times which determine a setup/hold window. The clock module includes clock phase adjustment circuitry to adjust clock phase so that the repetitive control signal transitions occur within a signal capture window between setup/hold windows.

In other aspects of the Disclosure, a method for capturing a repetitive signal relative to a clock includes: receiving a repetitive signal with repetitive signal transitions; generating a clock with active and inactive clock edges within a clock period; capturing the repetitive signal transitions at an active clock edge based on pre-defined setup and hold times which determine a setup/hold window; and adjusting clock phase so that the repetitive signal transitions occur within a signal capture window between setup/hold windows.

Other aspects and features of the invention claimed in this Patent Document will be apparent to those skilled in the art from the following Disclosure.

BRIEF DESCRIPTION OF THE DRAWINGS

FIG. 4A illustrates an example JESD204B (subclass 1) clock distribution and synchronization module [400] with DEVCLK (clock) [401] phase adjustment to provide a signal capture window aligned with a SYSREF control (timing phase reference) signal [402], including an adjustable delay clock generator [420] with a clock phase adjustment loop including a phase comparator [440] and controller [450], and an optional averager [460]; and FIG. 4B illustrates an example adjustable delay clock generator [420] including an example multi-tapped transmission line [430].

DETAILED DESCRIPTION

This Description and the Drawings constitute a Disclosure for clock generation with clock phase adjustment to align a clock-active-edge setup/hold window relative to a repetitive signal, positioning the repetitive signal (transition/assertion) within a (valid) signal capture window to meet setup/hold requirements, including describing design examples (example implementations), and illustrating various technical features and advantages.

This Disclosure uses the following nomenclature. "Clock" means a clock signal at a specified frequency with a period $T_{CLOCK}$, and having active and inactive edges, which, according to the convention adopted for this Disclosure including the Drawings, are respectively the rising and falling clock edges. "Control signal" means a repetitive control or data signal that is required to be captured deterministically at a clock active edge. "Setup" and "hold" times ("setup/hold" times) are pre-defined by the design/fabrication requirements of the clocked digital circuit design, and establish a setup/hold window relative to a clock active edge during which a control signal can be captured deterministically, with the control signal transition occurring during a preceding signal capture window so that the control signal meets the clock setup/hold requirements for deterministic signal capture. Within an operating period of interest, both the clock and the control signal are repetitive and fixed frequency.

In brief overview, clock generation is based on clock phase adjustment to align a setup/hold window relative to a repetitive (control/data) signal, positioning the repetitive signal within a signal capture window to meet setup/hold requirements. A clock module for capturing a repetitive signal relative to a clock includes clock circuitry to provide a clock with active and inactive clock edges within a clock period, and signal capture circuitry to capture repetitive signal transitions at an active clock edge, based on pre-defined setup and hold times which determine a setup/hold window. Clock phase adjustment circuitry is configured to adjust clock phase so that the repetitive signal transitions occur within a signal capture window between setup/hold windows. Clock phase adjustment can be based on: aligning the clock inactive edges to the repetitive signal transitions; and/or averaging successive phase comparisons of the clock and the repetitive signal transitions; and/or selectively performing an initial polarity inversion to generate a polarity inverted clock, and then adjusting clock phase of the polarity inverted clock. An example implementation is JESD204B (subclass1) to adjust DEVCLK phase relative to the SYSREF timing control reference.

Figure 1:
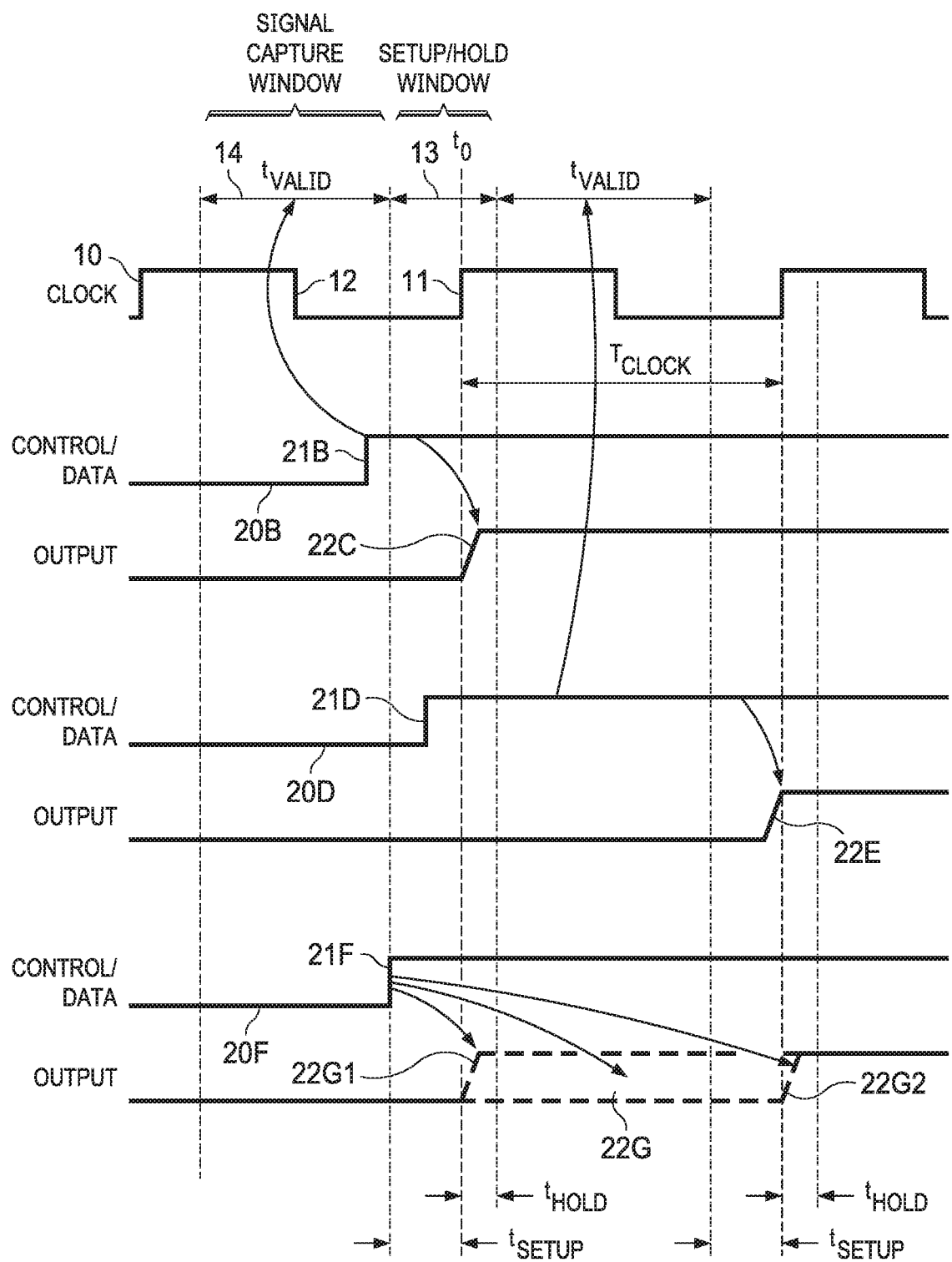
FIG. 1 provides example waveforms illustrating a clock [10] in relation to a repetitive control/data signal [20], including illustrating setup-and-hold times ($t_{SETUP}$ and $t_{HOLD}$) in relation to a clock active edge ($t_0$), establishing a setup/hold window [13] and a preceding signal capture window ($t_{VALID}$) [14], and illustrating: (a) signal capture for a control signal [20B] asserted [21B] within the $t_0$ signal capture window, and captured [22C] (deterministically) within the $t_0$ setup/hold window; (b) signal capture for a control signal [20D] asserted [21D] after the $t_0$ signal capture window (within the setup/hold window [13]), and captured [22E] (non-deterministically) at the next clock active edge; and (c) non-deterministic signal capture for a control signal [20F] illustratively asserted [21F] at the boundary between the $t_0$ signal capture window ($t_{VALID}$) [14] and the $t_0$ setup/hold window [13], so that signal capture [22G] occurs non-deterministically [22G1 or 22G2].

FIG. 1 provides example waveforms illustrating timing for capturing a control signal relative to a clock, such as implemented in clocked digital logic. The example waveforms indicate signal capture relative to illustrative setup and hold times, such as required in a clocked digital design for control signal (deterministic) latching.

A clock 10 with period $T_{CLOCK}$ includes an active edge 11 at time $t_0$ in a current clock period. Illustrative setup and hold times $t_{SETUP}$ and $t_{HOLD}$ are indicated for the clock active edge $t_0$, defining a setup/hold window 13 (pre-defined according to clocked digital logic parameters, including clock frequency). The setup/hold window 13 at the $t_0$ clock active edge is preceded by a signal capture window ($t_{VALID}$) 14, which illustratively includes a preceding clock inactive edge 12 (although that is not a requirement for a valid signal capture window).

With clock speed increases to giga-sample clock rates, the $T_{CLOCK}$ period decreases, so that the signal capture window ($t_{VALID}$) for deterministic data latching within a setup/hold window is correspondingly constrained, $$t_{VALID} = T_{CLOCK} - t_{SETUP} - t_{HOLD},$$

which can be on the order of 100-200 ps, and correspondingly increasing constraints on timing margins for meeting setup and hold requirements, including at the board and system level.

Timing for control/data signal capture (assertion/transition) is illustrated in relation to the $t_0$ clock active edge, including an illustrative setup/hold window 13 and preceding signal capture window 14. Signal latching is illustrated for control signals 20B (216/21C), 20D (21D/21E), and 20F (21F/21G), including deterministic and non-deterministic signal capture of the control signals in relation to the clock setup/hold window 13.

Referring to control signal 20B in relation to the clock 10 and the $t_0$ clock active edge 11, control signal 20B is asserted (transitions) at 21B, within the $t_0$ signal capture window 14 preceding the $t_0$ clock active edge, prior to the $t_0$ setup/hold window 13, and in particular prior to the beginning of the $t_0$ setup time. As a result, control signal 20B meets the setup/ hold requirements, and is captured (deterministically) at 22C within the $t_0$ signal capture window 13, and in particular during the $t_0$ hold time.

Referring to control signal 20D in relation to the clock 10 and the $t_0$ clock active edge 11, control signal 20D is asserted (transitions) at 21D, after the preceding $t_0$ signal capture window 14, and after the beginning of the $t_0$ setup time, which is deterministically late for the $t_0$ clock active edge. As a result, control signal 20D is captured (non-deterministically) in the next $T_{CLOCK}$ at 22E, i.e. within the hold time for the next the clock active edge. In effect, any time the control signal transitions inside the setup/hold window, the capture is non-deterministic because it cannot be determined with certainty whether it will be captured at that active edge or the next active edge.

Referring to control signal 20F in relation to the clock 10 and $t_0$ clock active edge 11, control signal 20F is asserted (transitions) nominally at the boundary 21F between the $t_0$ signal capture window 14 and the $t_0$ setup/hold window 13. As a result of variations is signal path and logic design that affect timing margins, such boundary transitions can be considered inherently non-deterministic, so that control signal 20F is captured non-deterministically (unpredictably) either in the $t_0$ clock period at 22G1, within the $t_0$ setup/hold window, or in the next clock period at 22G2.

The timing constraints in FIG. 1 illustrate that if control signals are to be captured (latched) deterministically, they need to be positioned within a signal capture window preceding a setup/hold window, providing sufficient timing margin to meet setup/hold requirements. Considerations for positioning control signals within a signal capture window that meets setup/hold requirements (timing margins) can include accounting for variations in signal path and logic design related to differences in control/data and clock paths (such as the use of dc coupling for control/data and ac coupling for clock), differences signal amplitudes (and related propagation delays) resulting from the effect of impedance discontinuities for higher frequency clock signals versus lower frequency control/data signals, as well as manufacturing variability, aging, and changes in temperature or supply voltage.

Figure 2:
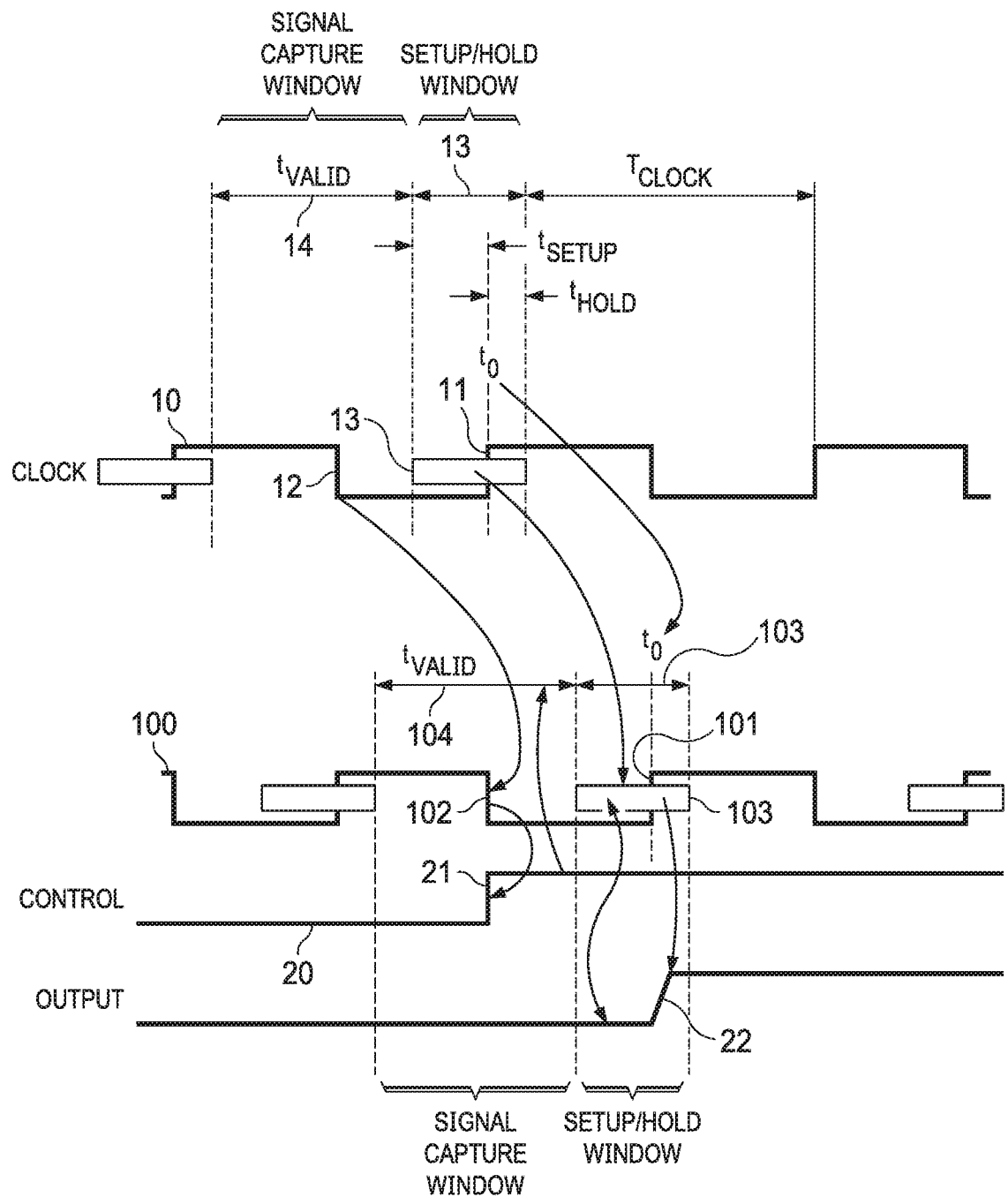
FIG. 2 provides example waveforms illustrating clock generation with clock phase adjustment to align a setup/hold window [13, 103] with respect to a repetitive control signal [20] according to the Disclosure, so that the control signal is positioned within a signal capture window [14] to meet defined setup/hold requirements, including illustrating an example clock phase adjustment in which a $t_0$ clock active edge [10, 11] is delayed [100, 101] so that the preceding clock inactive edge [10, 12] is aligned [100, 102] with the control signal transition [20, 21], resulting in a corresponding delay of the $t_0$ setup/hold window [13 to 103] and associated signal capture window [14 to 104], so that the control signal transition [21] occurs within the signal capture window [104] for the $t_0$ clock active edge [100, 101], and is captured [22] within the $t_0$ setup/hold window [103].

FIG. 2 provides example waveforms illustrating clock generation with clock phase adjustment to align a setup/hold window relative to a repetitive signal according to the Disclosure, positioning the repetitive signal within a signal capture window to meet setup/hold requirements.

Clock 10 includes an active edge $t_0$ at 11, with illustrative setup and hold times $t_{SETUP}$ and $t_{HOLD}$ for the $t_0$ clock active edge defining a setup/hold window 13. The setup/hold window 13 at the $t_0$ clock active edge is preceded by a signal capture window ($t_{VALID}$) 14, which illustratively includes a preceding clock inactive edge 12.

A repetitive control signal 20 is asserted (transitions) at 21, which is after the signal capture window 14 for $t_0$ clock active edge. In the illustrated example, the control signal 20 transitions 21 substantially at the $t_0$ clock active edge, within the $t_0$ setup/hold window 13. As a result, this control signal assertion will not be deterministically captured in the $t_0$ TCLOCK, but rather non-deterministically at either the $t_0$ clock active edge or the next clock active edge.

Clock phase adjustment according to the Disclosure is used to effectively align the clock setup/hold window with respect to a repetitive control signal, so that the control signal is positioned within a preceding signal capture window to meet defined setup/hold requirements. In particular, a phase-adjusted clock 100 is delayed relative to the clock 10, delaying the $t_0$ clock active edge 11/101, and the associated sample/hold window 13/103 to align the control signal transition 21 within the $t_0$ signal capture window 14/104.

In the illustrated example, the $t_0$ clock active edge 10/11 is delayed 100/101, so that the preceding clock inactive edge 12 is aligned 100/102 with the control signal transition 20/21. This clock phase adjustment effectively delays the setup/hold window 13/103, and the associated signal capture window 14/104.

As a result of clock phase adjustment, the control signal transition 21 is positioned within a valid signal capture window 100/104, so that the control signal is asserted prior to the $t_0$ setup time $t_{SETUP}$, meeting the setup requirement for deterministic signal capture at the $t_0$ clock active edge. As a result, the control signal is captured 22 during the hold time $t_{HOLD}$ for the $t_0$ clock active edge.

That is, for the illustrative clock phase adjustment, the control signal transition 21 is aligned with a clock inactive edge, between clock active edges, ensuring positioning within a valid signal capture window 100/104, transitioning (asserting) prior to the setup/hold window 103 for the $t_0$ clock active edge. This clock phase adjustment provides maximum timing margins for meeting setup/hold requirements for deterministically capturing the repetitive control signals.

Note that, because the clock 10/100 is periodic, clock phase adjustment will not create ambiguity in the timing for capturing the control signal 20 based on the phase shifted $t_0$ clock active edge (which effectively phase shifts the setup/hold window). Note also that because the timing of the control signal affects clock phase, the control signal effectively becomes the master timing alignment.

Clock generation with clock phase adjustment according to the Disclosure is used to effectively align a setup/hold window relative to a repetitive signal, positioning the repetitive signal within a signal capture window to meet setup/hold requirements. Clock phase adjustment to meet setup/hold requirements according to the Disclosure can be applied to any circuit where a repetitive control (or data) signal needs to be captured based on setup/hold requirements relative to a fixed frequency clock.

Figure 3:
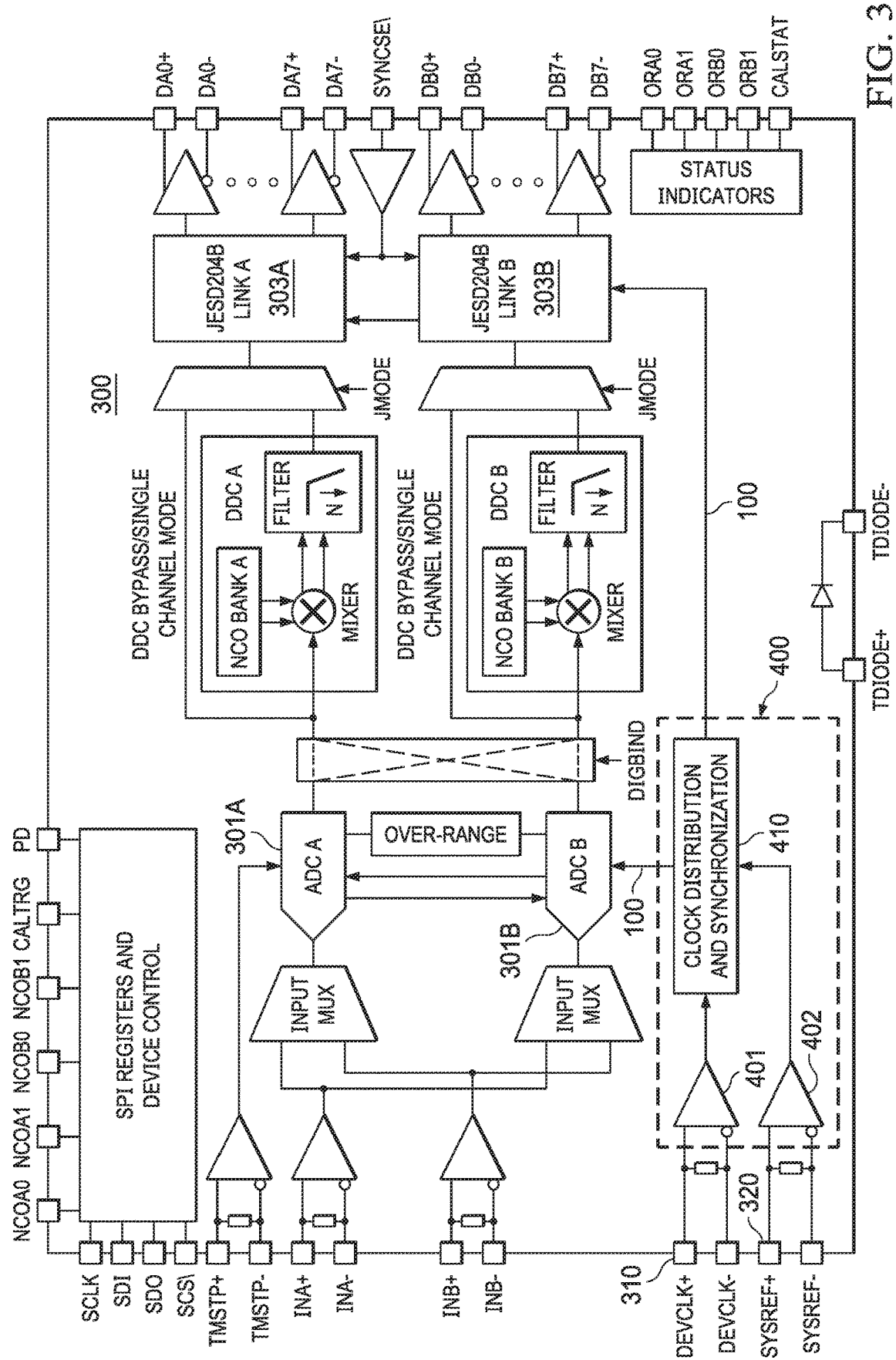
FIG. 3 illustrates an example RF Sampling ADC [300] with dual ADCs [301A/301B], and an example JESD204B serial interface [303A/303B] and JESD204B clock synchronization based on a JESD204B generated DEVCLK (device clock) and SYSREF (timing phase reference) [310, 320] repetitive control signal, and including an example clock distribution and synchronization module [400] providing a local multi-frame clock (LMFC) [100] with JESD204B subclass 1 deterministic link latency compliance and multi-device synchronization based on the SYSREF timing phase reference signal (source synchronous with the DEVCLK), the clock distribution and synchronization module generating the LMFC clock with DEVCLK phase adjustment according to the Disclosure, so that SYSREF meets DEVCLK setup-and-hold times.

FIG. 3 illustrates an example RF Sampling ADC 300 with dual ADCs 301A and 301B. ADC 300 includes an example JESD204B serial interface with dual JESD204B link drivers 303A and 303B. Multi-device clock synchronization is based on a JESD204B (subclass 1) generated device clock DEVCLK 310, and a timing phase reference SYSREF (repetitive) control signal 320. JESD204B DEVCLK and SYSREF are provided by an external JESD204 clock generator (not shown).

An example clock distribution and synchronization module 400 receives through a JESD204B differential clock interface DEVCLK± 310/401 and SYSREF± 320/402. The clock distribution and synchronization module 400 generates an internal local multi-frame clock (LMFC) 100 that provides a sampling clock for the ADCs 301A/301B, and the JESD204B LMFC clock to the JESD204B LINK A/B drivers 303A/303B.

LMFC clock generation is based on DEVCLK and SYSREF, providing JESD204B subclass 1 deterministic link latency compliance, and multi-device synchronization based on the SYSREF timing phase reference control signal (source synchronous with the DEVCLK). The clock distribution and synchronization module 400 generates the LMFC clock based on clock phase adjustment to align the LMFC clock (setup/hold window) with respect to the SYSREF control signal according to the Disclosure, so that the SYSREF control signal is positioned within a signal capture window to meet defined setup/hold requirements for the LMFC (phase adjusted DEVCLK), including the operating requirements for the RF sampling ADC 300.

Figure 4A:
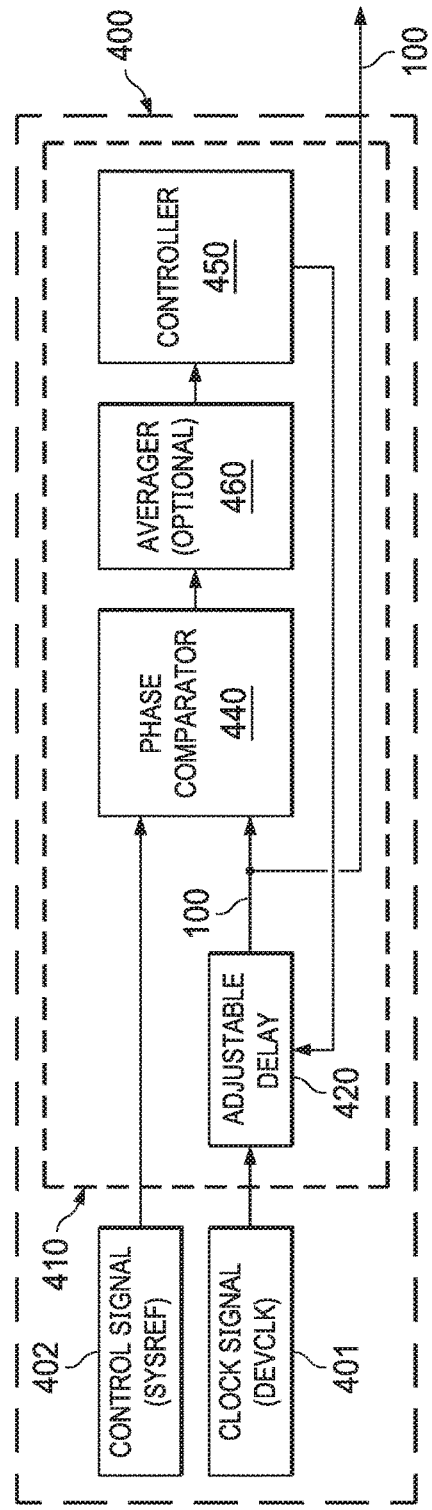
FIGS. 4A and 4B illustrates an example clock generator with clock phase adjustment so that a repetitive control signal meets clock setup-and-hold times, according to the Disclosure.
Figure 4B:
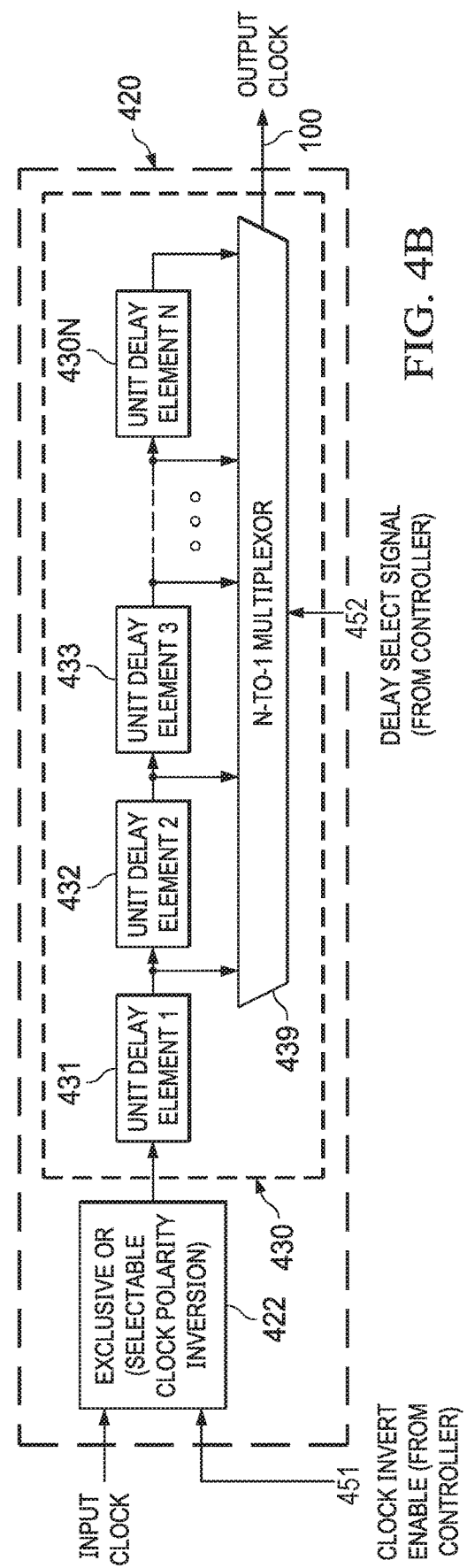

FIGS. 4A and 4B illustrates an example clock generator module 400, such as can be implemented in the RF sampling ADC of FIG. 3 (the clock distribution and synchronization module 400). Clock generator 400 implements clock generation with clock phase adjustment to align a DEVCLK (clock) setup/hold window relative to a repetitive SYSREF (control) timing reference signal according to the Disclosure, positioning SYSREF within a phase shifted signal capture window to meet setup/hold requirements.

FIG. 4A illustrates an example JESD204B (subclass 1) clock generator module 400, with interface to receive DEVCLK 401 and SYSREF 402. A clock generator 410 includes an adjustable delay clock generator 420 to generate the clock 100 (LMFC), phase adjusted to align the DEVCLK setup/hold window relative to the repetitive SYSREF control signal, positioning SYSREF within a signal capture window to meet setup/hold requirements.

Clock generator 410 includes a clock phase adjustment loop to control clock phase adjustment for the adjustable delay clock generator 420. The clock phase adjustment loop includes a phase comparator 440 and controller 450, and an optional averager 460. An advantage of a repetitive control signal, such as SYSREF, is that it can be averaged, so that the absolute timing placement of the clock and centering of the valid signal capture window are not affected by jitter (cycle-to-cycle variation) of the SYSREF control signal.

Each time the SYSREF control signal transitions, phase comparator 440 determines if the clock 100 is high or low. The phase comparison result is provided to the (optional) averager 460. The averager collects results from the phase comparator over a period of time determined by the controller 450, and provides the most common result to the controller.

Based on phase comparison result from the averager 460, the controller 450 provides clock phase adjustment control to the adjustable delay clock generator 420.

FIG. 4B illustrates an example adjustable delay clock generator 420 including an (optional) input polarity inversion block 422, and an example multi-tapped transmission delay line 430.

Polarity inversion is optional. For the example adjustable delay clock generator 420, polarity inversion is included in the clock phase adjustment loop to simplify phase adjustment (reducing the required clock phase adjustment range). Controller 450 provides a clock invert enable signal 451 to the polarity inversion block 422 to control clock polarity inversion.

The multi-tapped transmission delay line 430 includes unit delay elements 431-430N providing tapped inputs to a N-to-1 multiplexor 239 controlled by a delay select signal 452 from controller 450. Based on the a delay select signal 452 from controller 450, the multiplexer 239 selects for output a phase adjusted (delayed) clock 100 (such as the LMFC clock in FIG. 3). Use of an on-die multi-tapped transmission delay ling 430 suppresses jitter from the clock phase adjustment.

Referring to FIGS. 4A/4B, controller 450 implements an example binary search algorithm to adjust clock delay, providing the polarity inversion signal 451 and delay select signal 452 to the adjustable delay clock generator 420. For the example embodiment, the clock is phase adjusted (shifted) until the clock inactive (falling) edge is aligned with the SYSREF transition (rising edge).

The example binary search routine for clock phase adjustment is performed based on step adjustments S with a selectable step size. Controller 450 initializes the clock delay to one quarter of the maximum delay setting. The controller then performs an example clock phase adjustment routine, instructing the averager 460 to collect a selected number of phase comparison results from phase comparator 440: (a) if the result from the averager is "high", the clock 100 is mostly high when SYSREF transitions, so the controller decreases the clock delay by the step size S (delay select signal); and (b) if the result from the averager is 'low', the clock is mostly low when SYSREF transitions, so the controller increases the clock delay by step size S (delay select signal).

After each clock phase adjustment, controller 450 repeats the example clock phase adjustment routine, with selectable step size S changes. For the example clock phase adjustment routine, for the first and second executions, S is $\frac{1}{4}^{th}$ of the maximum delay setting. For the third and all subsequent executions, S is one half of the previous value of S.

Once the step size S is smaller than a pre-defined minimum adjustment step, the inactive (falling) edge of the phase adjusted (delayed) clock 100 is substantially aligned with the SYSREF transition, and the clock phase adjustment routine completes.

If the clock phase adjustment does not have sufficient range to align the clock inactive edge to the SYSREF control signal transition, the example clock phase adjustment routine will saturate the delay setting, and the valid signal capture window will not necessarily be aligned (centered) to the clock inactive edge (FIG. 2, clock inactive edge 102 aligned to the control signal transition 21), but will be twice the value of the maximum delay setting.

The example binary search routine for clock phase adjustment implemented by controller 450 is configured to center the repetitive SYSREF control signal transitions between clock active edge setup/hold windows, and aligned to a clock inactive edge. This example clock phase adjustment approach assumes a 50% duty cycle clock. The example clock phase adjustment routine also assumes that the SYSREF control signal is active high, although the routine can be adapted for active low transitions.

The example clock phase adjustment routine also takes advantage of the fact that the clock signal can be inverted in polarity (FIG. 4B, the clock invert enable signal 451 provided to the input polarity inversion block 422 in the adjustable delay clock generator 420). As noted, polarity inversion simplifies phase adjustment by reducing the required clock phase adjustment range to optimize the sampling instance of SYSREF.

Figure 5:
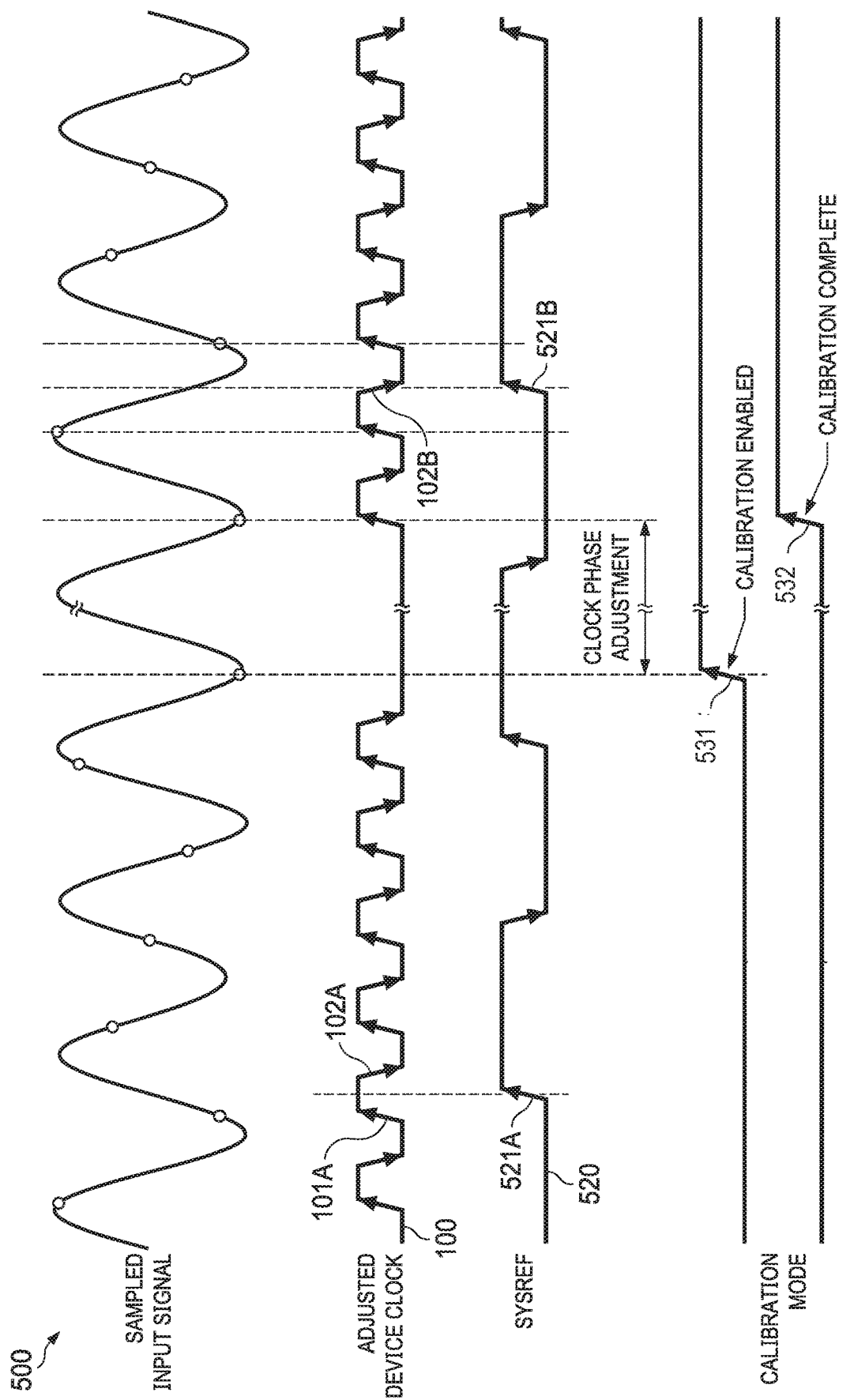
FIG. 5 provides example waveforms illustrating clock phase adjustment to align a CLOCK [100] setup/hold window relative to a repetitive SYSREF control signal [520] according to the Disclosure, positioning the repetitive SYSREF control signal within a signal capture window to meet setup/hold requirements, including illustrating example clock phase adjustment to align a clock inactive edge [102B] to the SYSREF control signal [521B] (within a signal capture window), and including an example calibration mode [531, 532] implementation for clock phase adjustment.

FIG. 5 provides example waveforms illustrating clock phase adjustment to align a setup/hold window relative to a repetitive SYSREF control signal according to the Disclosure, positioning the SYSREF control signal within a signal capture window to meet setup/hold requirements.

DEVCLK 100 is initially unadjusted, so that the SYSREF control signal 520 transitions 521A during clock high, between the clock active and inactive edges 101A and 102A. After clock phase adjustment, the DEVCLK inactive edge 102B is aligned with the SYSREF transition 521B.

Clock phase adjustment can be implemented as an automatic (such as at power-up) calibration routine. Calibration mode is initiated by a calibration enable signal 531 (to the clock generator 410 in FIGS. 3 and 4A), and terminated 532 after clock phase adjustment, with the DEVCLK inactive edge 102B aligned to the SYSREF control signal transition 521B.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit comprising:
   a signal input terminal to receive a repetitive signal having repetitive signal transitions;
   clock circuitry having a clock with active and inactive clock edges within a clock period;
   signal capture circuitry to capture the repetitive signal transitions on an active clock;
   clock phase adjustment circuitry to adjust clock phase so that the repetitive signal transitions occur within a signal capture window between setup/hold windows.

2. The circuit of claim 1, wherein the clock has clock high and clock low levels within a clock period, and the clock phase adjustment circuitry includes:
   phase comparison circuitry to determine, for each of selected repetitive signal transitions, if the clock level is clock high or clock low, and to generate a corresponding phase comparison signal;
   the clock phase adjustment circuitry configured to adjust clock phase based on the phase comparison signals.

3. The circuit of claim 2, the clock phase adjustment circuitry including:
   averager circuitry to average a selected number of successive phase comparison signals, and to generate a corresponding averager result;
   the clock phase adjustment circuitry configured to adjust clock phase based on the averager result of the selected number of phase comparison signals.

4. The circuit of claim 1, wherein the clock phase adjustment circuitry is configured
   to selectively perform an polarity inversion of the clock to generate a polarity inverted clock; and
   to adjust clock phase of the polarity inverted clock.

5. The circuit of claim 1, wherein the clock is a fixed frequency clock with a substantially fifty percent duty cycle, and wherein
   the clock phase adjustment circuit is configured to align the inactive clock edges to the repetitive control signal transitions.

6. The circuit of claim 5:
   the clock phase adjustment circuitry including phase comparison circuitry to compare a phase of a repetitive signal transition to a phase of the clock, and to generate a corresponding phase comparison signal;
   the clock phase adjustment circuitry configured to adjust clock phase in pre-defined steps;
   for each step,
      the phase comparison circuitry configured to generate the corresponding clock phase comparison signal, and
      the clock phase adjustment circuitry configured to adjust clock phase based on the phase comparison signal.

7. The circuit of claim 6, wherein the clock phase adjustment circuitry is configured
   to selectively perform an initial polarity inversion of the clock to generate a polarity inverted clock; and
   to adjust clock phase of the polarity inverted clock.

8. The circuit of claim 6, the clock phase adjustment circuitry including:
   averager circuitry to average a selected number of phase comparison signals, and to generate a corresponding averager result;
   the clock phase adjustment circuitry configured to adjust clock phase based on the averager result.

9. The circuit of claim 1, wherein the clock phase adjustment circuitry operates during a calibration mode of operation.

10. The circuit of claim 1, wherein the circuit operates in a system with a JESD204B (subclass 1) clock generator that provides a JESD204B global device clock and a JESD204B SYSREF timing reference signal, and wherein
    the signal input to receive the global device clock;
    the signal input to receive the SYSREF signal as the repetitive signal with repetitive signal transitions; and
    the clock circuitry to provide the clock with active and inactive clock edges within a clock period, based on the global device clock.

11. An device comprising:
    a clock interface to receive a system device clock, and a repetitive control signal with repetitive control signal transitions;
    a clock module to generate an internal device clock based on the system device clock and the repetitive control signal, the clock module comprising:
       clock circuitry to provide the internal device clock with active and inactive clock edges within a clock period, based on the system device clock;
       signal capture circuitry to capture the repetitive control signal transitions at an active clock edge based on pre-defined setup and hold times which determine a setup/hold window;
       clock phase adjustment circuitry to adjust clock phase so that the repetitive control signal transitions occur within a signal capture window between setup/hold windows.

12. The device of claim 11, wherein the system device clock has clock high and clock low levels within a clock period, and the clock phase adjustment circuitry includes:
    phase comparison circuitry to determine, for each of selected repetitive control signal transitions, if the clock level is clock high or clock low, and to generate a corresponding phase comparison signal;
    the clock phase adjustment circuitry configured to adjust clock phase based on the phase comparison signals.

13. The device of claim 11, the clock phase adjustment circuitry including:
    averager circuitry to average a selected number of successive phase comparison signals, and to generate a corresponding averager result;
    the clock phase adjustment circuitry configured to adjust clock phase based on the averager result of the selected number of phase comparison signals.

14. The device of claim 11, wherein the clock phase adjustment circuitry is configured
    to selectively perform an initial polarity inversion of the system device clock to generate a polarity inverted system device clock; and
    to adjust clock phase of the polarity inverted system device clock.

15. The device of claim 11, wherein the system device clock is a fixed frequency clock with a substantially fifty percent duty cycle, and wherein the clock phase adjustment is configured to align the inactive clock edges to the repetitive control signal transitions.

16. The device of claim 15:
the clock phase adjustment circuitry including phase comparison circuitry to compare a phase of a repetitive control signal transition to a phase of the clock, and to generate a corresponding phase comparison signal;
the clock phase adjustment circuitry configured to adjust clock phase in pre-defined steps;
for each step,
    the phase comparison circuitry configured to generate the corresponding clock phase comparison signal, and
    the clock phase adjustment circuitry configured to adjust clock phase based on the phase comparison signal.

17. The device of claim 16, wherein the clock phase adjustment circuitry is configured
to selectively perform an initial polarity inversion of the system device clock to generate a polarity inverted system device clock; and
to adjust clock phase of the polarity inverted system device clock.

18. The device of claim 16, the clock phase adjustment circuitry including:
averager circuitry to average a selected number of phase comparison signals, and to generate a corresponding averager result;
the clock phase adjustment circuitry configured to adjust clock phase based on the averager result.

19. The device of claim 11, wherein the system clock generator is a JESD204B (subclass 1) clock generator that provides a JESD204B global device clock as the system device clock, and a JESD204B SYSREF timing reference signal as the repetitive control signal.

20. A method for capturing a repetitive signal relative to a clock, comprising:
receiving a repetitive signal with repetitive signal transitions;
generating a clock with active and inactive clock edges within a clock period;
capturing the repetitive signal transitions at an active clock edge based on pre-defined setup and hold times which determine a setup/hold window; and
adjusting clock phase so that the repetitive signal transitions occur within a signal capture window between setup/hold windows.

21. The method of claim 20, wherein the clock is a fixed frequency clock with a substantially fifty percent duty cycle, and wherein:
clock phase is adjusted to align the inactive clock edges to the repetitive control signal transitions.

22. The method of claim 20, wherein:
clock phase is adjusted based on averaging successive phase comparisons of the system device clock and the repetitive control signal transitions.

23. The method of claim 20, wherein:
clock phase is adjusted based on selectively performing an initial polarity inversion to generate a polarity inverted system device clock, and then adjusting clock phase of the polarity inverted system device clock.

24. The method of claim 20 wherein:
clock phase is adjusted according to a binary search routine in which
    the clock phase adjustment circuitry configured to adjust clock phase in pre-defined steps;
    for each step,
        the phase comparison circuitry configured to generate the corresponding clock phase comparison signal, and
        the clock phase adjustment circuitry configured to adjust clock phase based on the phase comparison signal.

* * * * *